(12) United States Patent
Hosonuma et al.

(10) Patent No.: US 7,438,790 B2
(45) Date of Patent: Oct. 21, 2008

(54) ELECTRODE FOR ELECTROLYSIS AND PROCESS FOR PRODUCING THE SAME

(75) Inventors: Masashi Hosonuma, Fujisawa (JP);
Masaharu Uno, Fujisawa (JP);
Tomoyasu Shibata, Fujisawa (JP);
Yoshinori Nishiki, Fujisawa (JP);
Tsuneto Furuta, Fujisawa (JP)

(73) Assignee: Permelec Electrode Ltd., Kanagawa (JP)

( * ) Notice: Subject to any disclaimer, the term of this patent is extended or adjusted under 35 U.S.C. 154(b) by 269 days.

(21) Appl. No.: 11/491,917

(22) Filed: Jul. 25, 2006

(65) Prior Publication Data
US 2007/0029190 A1    Feb. 8, 2007

(30) Foreign Application Priority Data
Aug. 3, 2005   (JP)   ............... P.2005-225476

(51) Int. Cl.
*C25B 11/12*   (2006.01)

(52) U.S. Cl. ............... 204/294; 427/78; 427/249.5; 427/249.8; 427/249.9; 427/309; 117/90; 117/92; 117/97; 117/103

(58) Field of Classification Search ............... 204/294; 427/78, 249.5, 249.8, 249.9, 309; 117/90, 117/92, 97, 103
See application file for complete search history.

(56) References Cited

U.S. PATENT DOCUMENTS

| | | | |
|---|---|---|---|
| 7,232,508 B2 * | 6/2007 | Hosonuma ............... 204/290.12 |
| 7,273,536 B2 * | 9/2007 | Shibata et al. ............... 204/294 |
| 2003/0064225 A1 * | 4/2003 | Ohashi et al. ............... 428/408 |
| 2004/0226817 A1 * | 11/2004 | Hosonuma ............... 204/280 |
| 2005/0186345 A1 * | 8/2005 | Shibata et al. ............ 427/249.7 |

* cited by examiner

Primary Examiner—Bruce F. Bell
(74) Attorney, Agent, or Firm—Sughrue Mion, PLLC (57) ABSTRACT

The present invention provides an electrode for electrolysis including: a conductive substrate; and a conductive diamond formed on a surface of the conductive substrate, the conductive substrate having at least one surface shape selected from the group consisting of: (a) a surface shape of a combination of an Ra of 100-1,000-µm and an RSm of 50-10,000 µm; (b) a surface shape of a combination of an Ra of 2.5-100 µm and an RSm of 1.5-800 µm, and (c) a surface shape of a combination of an Ra of 0.01-2 µm and an RSm of 0.005-250 µm, and a process for producing the electrode.

5 Claims, 3 Drawing Sheets

ELECTRODE FOR ELECTROLYSIS AND PROCESS FOR PRODUCING THE SAME

FIELD OF THE INVENTION

The present invention relates to electrodes for electrolysis and processes for producing the electrodes. More particularly, the invention relates to electrodes for electrolysis with which substances contained in wastewaters, raw water for drinking water, or the like and exerting adverse influences on the human body or environment can be efficiently decomposed and removed and the synthesis of ozone, persulfuric acid, percarbonic acid, or the like can be efficiently conducted and which are conductive diamond electrodes excellent in durability and profitability when used especially as anodes, and to processes for producing these electrodes.

BACKGROUND OF THE INVENTION

An electrolytic process is a process in which electrical energy, which is a clean energy, is utilized and chemical reactions occurring on the electrode surfaces can be controlled. Furthermore, since an oxidation reaction and a reduction reaction proceed at different places, i.e., on the anode and the cathode, reaction products can be isolated by a simple operation. The process is a basic technique generally used for the electrolysis of sodium chloride, electroplating, metal collection, metal refining, etc. Recently, the process is coming to be utilized for wastewater treatment, e.g., a treatment for making an organic wastewater harmless.

On the other hand, oxidation reactions at the anode yield substances effective in water treatment, such as oxidizing agents, e.g., effective chlorine and ozone, and active species, e.g., OH radicals. Water containing these substances hence is in general use under the name of active water, functional water, ion water, sterilization water, etc. Recently, this water has come to be called exclusively as electrolytic water.

Although electrolytic processes are being practically used as shown above, there are cases where intended reactions do not sufficiently proceed depending on the electrode materials. In general, in electrolysis in an aqueous solution, the water undergoes electric discharge to evolve oxygen and hydrogen respectively at the anode and cathode. In the case where the intended reaction is one involving neither oxygen evolution nor hydrogen evolution, it is necessary to minimize the progress of the water discharge reactions because the discharge of water reduces the efficiency of the intended reaction.

There are two methods for minimizing the progress of the water discharge reactions. One is to select an electrode material which facilitates the progress of the intended reaction, i.e., an electrode catalyst having a low overvoltage in the intended reaction. The other is to use an electrode material which makes the water discharge reactions less apt to proceed, i.e., an electrode catalyst having a high oxygen overvoltage or hydrogen overvoltage, to thereby make the progress of the intended reaction relatively easy.

Examples of the former method include to use a DSA type electrode generally used as an anode for sodium chloride electrolysis. DSA type electrodes have a low chlorine overvoltage and, hence, use of this type of electrode enables the desired chlorine generation to occur preferentially to oxygen evolution. This method is effective because the cell voltage is minimal and the energy efficiency is high accordingly. However, this method is not applicable when the equilibrium potential in the intended reaction is nobler than that in the oxygen evolution reaction or is less noble than that in the hydrogen evolution reaction. For example, this method is not applicable to a treatment for decomposing persistent substances because the oxidation potential for the persistent substances is nobler than the equilibrium potential in oxygen evolution. For causing such reactions to proceed, the latter method can be employed.

Examples of the latter method include to use the cathode for sodium chloride electrolysis conducted by the mercury process and use an anode for electrolytic ozone generation. In the mercury-process sodium chloride electrolysis, mercury, which has a high hydrogen overvoltage, is used as the cathode to thereby realize discharge of sodium ions. In ozone generation, lead dioxide, which has a high oxygen overvoltage, is used as the anode to thereby realize both oxygen evolution and ozone generation.

Even when an intended reaction can be caused to proceed preferentially by selecting an electrode material as described above, this electrolytic process cannot be practically employed as long as the electrode material selected has insufficient corrosion resistance. In particular, the corrosion resistance of the anode material on which an oxidation reaction is to be conducted is one of major problems encountered in putting the electrolytic process into practical use.

The materials usable as the substrate of the anode are substantially limited to valve metals, e.g., titanium Ti, and alloys thereof, and the electrode catalysts also are limited to noble metals such as platinum (Pt) and iridium (Ir), oxides of such noble metals, lead oxide ($PbO_2$), and tin oxide ($SnO_2$). It is, however, known that even when such expensive materials are used, they are consumed depending on the density of the current applied and on the lapse of time and dissolve away in the solution. There is hence a desire for an electrode having better corrosion resistance.

Graphite and amorphous carbon materials also have been used as electrode materials. However, carbon electrodes are consumable electrodes and are considerably consumed especially in anodic polarization. Consequently, use of carbon electrodes is limited to applications where consumption is allowable or where there is no substitute material.

Diamond is excellent in thermal conductivity, optical transparency, and resistance to high temperatures and oxidation, and the electrical conductivity thereof can be regulated especially by doping. Conductive diamond to which conductivity has been imparted by doping is hence regarded as a promising material for use in semiconductor devices and energy conversion elements.

Recently, it was ascertained that conductive diamond has a wider potential window in aqueous solutions than the known electrode catalysts. Many reports have been made on basic and practical electrochemical properties of diamond electrodes employing conductive diamond. In particular, since diamond electrodes are the highest in oxygen overvoltage among the presently known electrode materials, many investigations have been made on the use of a diamond electrode as an anode so as to take advantage of the high oxygen overvoltage (see, for example, Journal of Electrochemical Society, Vol.141, 3382- (1994) and Electrochemistry, p. 521, Vol.72, No.7 (2004)).

Based on such knowledge, references 1 and 2 suggest that when diamond is used as an anode material, an organic wastewater can be decomposed. Reference 3 proposes a technique in which conductive diamond is used as an anode and a cathode to electrochemically treat organic substances. Reference 4 proposes a technique in which a conductive diamond electrode and a gas diffusion cathode for hydrogen peroxide generation are used as an anode and a cathode, respectively, to conduct water treatment. Furthermore, reference 5 discloses a technique in which a diamond electrode is used for synthesizing electrolytic water and ozone gas.

It can be expected from those investigations that in electrolytic processes using diamond electrodes having a wider potential window than electrodes heretofore in use, the intended reactions proceed at a higher efficiency than in the case of using the existing electrodes. However, these electrolytic processes have drawbacks, for example, that the diamond layer separates from the substrate during electrolysis and that the diamond layer is consumed with the continuation of electrolysis and the amount of the diamond thus consumed is proportional to the current density or quantity of electricity. An improvement in the durability of diamond electrodes has been desired from the standpoint of practical use. The diamond layer consumption is severe especially in aqueous solutions containing organic substances (see Electrochemical and Solid-State Letters, 6(12) D17-D19 (2003)).

Under these circumstances, many investigations have been made also on improvements in the durability of diamond electrodes.

Methods which have been developed for diamond film (layer) synthesis are hot-filament CVD, microwave plasma CVD, the plasma arc jet method, PVD, and the like. In a process generally used for diamond electrode production, polycrystalline diamond is deposited in a thickness of about several micrometers on a substrate such as a valve metal, silicon, carbon material, or the like by CVD.

In the CVD method general employed in diamond electrode production, the substrate undergoes a high-temperature reduction step conducted at about 700-900° C. It is therefore desirable that the thermal expansion coefficient of the substrate be close to that of diamond.

Silicon (Si) is alike to diamond in the thermal expansion coefficient and has the same crystal structure as diamond. Because of this, silicon is being most extensively investigated as the substrate of a diamond electrode. Since relatively large electrodes are necessary in industrial electrolysis, investigations are being made also on the use of metals and carbon materials which are easy to process and have high mechanical strength. In the case of using a diamond electrode, the substrate preferably is stable at noble potentials because the electrode is expected to function as an anode. Valve metals such as titanium and niobium and alloys based on these metals are hence being investigated extensively. Of these, niobium is regarded as a promising material for use as a substrate partly because of its property of being less apt to yield hydrides in a hydrogen atmosphere.

The surface state of a substrate influences the particle diameter and quality of the diamond to be deposited thereon by CVD and interfacial bonding between the diamond layer and the substrate. The surface state is hence thought to be an important factor which exerts a considerable influence on electrode life. In the CVD process, diamond layer deposition occurs from diamond nuclei and the layer grows thereon. Because of this, after the diamond layer formation, the areas where no nuclei were present remain as voids at the interface between the diamond layer and the substrate. It is therefore thought that the presence of diamond nuclei exerts a considerable influence on the life of the electrode.

For imparting the diamond nuclei, use may be made of a method in which a substrate is subjected to a treatment called a marring treatment to impart mars of a nanometer-order size to the substrate surface and diamond nuclei are generated at the mars in the initial stage of a CVD process. Alternatively, use may be made of a method in which a substrate is subjected to the so-called seeding treatment in which fine diamond particles are imparted to the substrate surface prior to a CVD treatment. When a substrate surface is polished with fine diamond particles, marring and seeding are conducted simultaneously.

The surface of a substrate is rugged, and has valleys corresponding to recesses and tops corresponding to protrusions (hereinafter the tops and valleys are inclusively referred to as tops/valleys). With respect to the surface state of the substrate, the following have been found.

(1) Tops/valleys having a depth of 0.002 µm or smaller are eliminated in a CVD process and bring about no effect.

(2) Tops/valleys of 0.002-0.02 µm influence the density of nuclei to be generated.

(3) When a surface shape having tops/valleys of about 0.1-2 µm is formed, this is expected to bring about a longer life than mirror finish.

(4) The effect brought about by tops/valleys of 0.3-1 µm is attributable not to the generation of nuclei but to the so-called anchoring effect, which improves the adhesion strength of the film deposited (see, for example, NEW DIAMOND, Vol.7, 7-13 (1991)).

References 6 to 9 disclose some techniques concerning the surface shape of a substrate for use as an industrial electrode material. However, none of these discloses an effect in diamond electrode production.

Reference 10 discloses a technique of two-layer coating for the purpose of life improvement. Reference 11 discloses a method for adhesion enhancement and substrate protection which comprises forming an interlayer of, e.g., a carbide on the substrate surface.

Also disclosed besides the techniques described in those references is a technique which comprises forming a diamond layer, subsequently removing the substrate, and using the resultant free-standing diamond as an electrode. In this case, diamond layer separation from the substrate, which is one of the problems of diamond electrodes, does not occur. However, it is necessary to form a diamond layer in a thickness sufficient for maintaining a structure as a free-standing electrode, e.g., about several millimeters, resulting in an exceedingly high electrode production cost. Even when the free-standing diamond has a thickness of about several millimeters, the strength thereof is insufficient in electrolytic applications where a relatively large electrode is necessary (see A. Fujishima, Y. Einaga, T. N. Rao, and D. A. Tryk, eds., Diamond Electrochemistry, BKC and Elsevier).

Electrode developments proceed based on the techniques concerning diamond described above. However, no electrode having a satisfactory electrode life in industrial fields, in particular, electrolytic processes, has been commercialized. It has hence become necessary to develop a diamond electrode which has durability for use in industrial electrolysis and can be easily made to have a large size.

[Reference 1] U.S. Pat. No. 5,399,247
[Reference 2] JP-A-7-299467
[Reference 3] JP-A-2000-226682
[Reference 4] JP-A-2000-254650
[Reference 5] JP-A-11-269685
[Reference 6] JP-A-2002-30495
[Reference 7] JP-A-4-301062
[Reference 8] JP-A-3-47999
[Reference 9] JP-A-1-177399
[Reference 10] JP-A-2004-231983
[Reference 11] JP-A-9-268395

SUMMARY OF THE INVENTION

An object of the invention is to provide an electrode for electrolysis which has been produced by coating the surface of a substrate made of a material such as a valve metal, valve-metal-based alloy, silicon, or carbon with a conductive diamond layer especially by CVD and in which the substrate has a surface shape effective in prolonging the electrolytic life of the electrode for electrolysis. Another object of the invention is to provide a process for producing the electrode.

The present inventors have made eager investigation to examine the problem. As a result, it has been found that the foregoing objects can be achieved by the following electrodes for electrolysis and the following processes for producing the electrode. With this finding, the present invention is accomplished.

The present invention is mainly directed to the following items:

1. An electrode for electrolysis comprising: a conductive substrate; and a conductive diamond formed on a surface of the conductive substrate, the conductive substrate having at least one surface shape selected from the group consisting of: (a) a surface shape of a combination of an Ra of 100-1,000 μm and an RSm of 50-10,000 μm; (b) a surface shape of a combination of an Ra of 2.5-100 μm and an RSm of 1.5-800 μm; and (c) a surface shape of a combination of an Ra of 0.01-2 μm and an RSm of 0.005-250 μm.

2. The electrode for electrolysis according to item 1, wherein the surface shape (c) is a combination of an Ra of 0.01-0.1 μm and an RSm of 0.005-20 μm.

3. A process for producing an electrode for electrolysis, the process comprising: conducting a surface treatment on a surface of a conductive substrate by at least one method selected from the group consisting of: (a) machining to form recesses and protrusions having an Ra of 100-1,000 μm and an RSm of 50-10,000 μm on the surface of the conductive substrate; (b) blasting to form recesses and protrusions having an Ra of 2.5-100 μm and an RSm of 1.5-800 μm; and (c) at least one of etching and heat-treating to form recesses and protrusions having an Ra of 0.01-2 μm and an RSm of 0.005-250 μm on the surface of the conductive substrate, and coating the conductive substrate having the recesses and protrusions with a conductive diamond layer.

4. The process for producing an electrode for electrolysis according to item 3, wherein the method (c) is at least one of etching and heat-treating to form recesses and protrusions having an Ra of 0.01-0.1 μm and an RSm of 0.005-20 μm on the surface of the conductive substrate.

5. The process for producing an electrode for electrolysis according to item 3, wherein the coating of the surface of the conductive substrate with the conductive diamond layer is conducted by the CVD method.

The invention will be explained below in detail.

The surface shapes of the conductive substrate of each of the electrode for electrolysis according to the invention are defined with the arithmetic mean height (Ra) in a roughness curve and the average length (RSm) of roughness curve elements which are provided for in JIS B 0601: 2001, and are classified by the definition.

Figure 1:
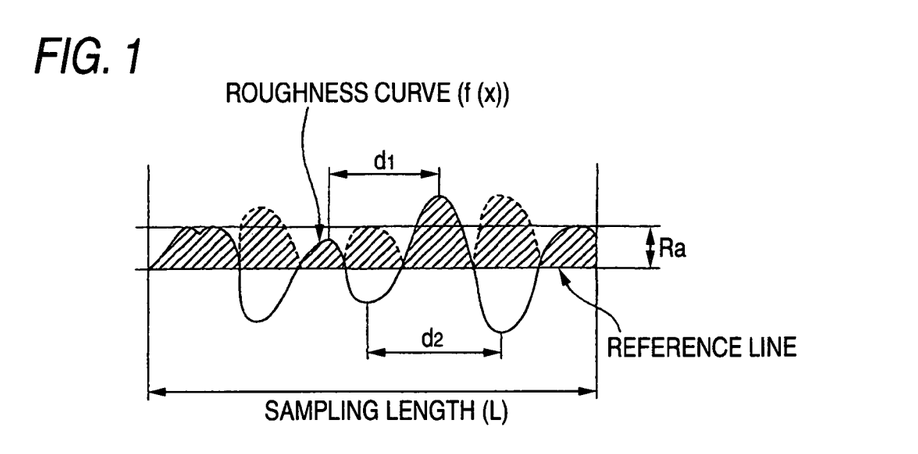
FIG. 1 is a view illustrating the arithmetic mean height (Ra) and the average length of roughness curve elements (RSm) in the invention.

The arithmetic mean height (Ra) as used in the invention is a value obtained from a roughness curve (y=f(x)) by determining a reference line for the curve as shown in FIG. 1, integrating the absolute values of the roughness curve, which are determined using the reference line as a base, over a sampling length (L), and dividing the resultant value by L. The arithmetic mean height (Ra) is expressed by equation (1).

On the other hand, the average length (RSm) of roughness curve elements is the average of the distances between adjacent tops on the surface ($d_1$ in FIG. 1) or of the distances of adjacent valleys in the surface ($d_2$ in FIG. 1).

$$Ra = \frac{1}{L}\int_0^L |f(x)| dx \quad (1)$$

For determining Ra and RSm, use can be made of a measuring device such as a surface roughness meter or an optical microscope. High-sensitivity microscopes employing a laser light have come to be on the market recently, and are utilizable for the determination. The plane-direction and height-direction resolutions of this kind of laser microscope are higher than those of stylus type surface roughness meters and, hence, a more precise measurement is possible. In particular, determination of RSm is more influenced by plane-direction resolution.

When a laser microscope is used in determining Ra and RSm, the resolutions thereof are desirably as follows. In a measurement in plane directions (RSm), the resolution of the microscope is desirably finer than 0.01 μm. In a measurement in the height direction (Ra), the resolution thereof is desirably 0.01 μm or finer.

The values of RSm and Ra in this specification are values obtained through measurements with a laser microscope having a plane-direction resolution of 0.01 μm and a height-direction resolution of 0.01 μm.

The electrodes for electrolysis of the invention are desirably ones produced by using a valve metal, such as niobium, tantalum, titanium, or zirconium, an alloy based on one or more of such metals, silicon, or a carbon material as a substrate and coating this substrate with a conductive diamond layer by CVD. However, the electrodes for electrolysis of the invention should not be construed as being limited to this electrode.

In the invention, the substrate has at least one surface shape selected from the group consisting of: (a) a surface shape of a combination of an Ra of 100-1,000 μm and an RSm of 50-10,000 μm; (b) a surface shape of a combination of an Ra of 2.5-100 μm and an RSm of 1.5-800 μm; and (c) a surface shape of a combination of an Ra of 0.01-2 μm and an RSm of 0.005-250 μm. The surface shape (c) is preferably a combination of an Ra of 0.01-0.1 μm and an RSm of 0.005-20 μm.

Furthermore, it is preferable that the substrate has two or more of the surface shapes (a) to (c), and more preferable having all of the surface shapes (a), (b), and (c).

In the case where surface shapes having different combinations are to be formed, the surface of a conductive substrate is subjected successively to surface processings in order of increasing fineness. For example, the whole substrate surface is first processed so as to form a rugged surface having the surface shape (a). Subsequently, the flat and curved parts of the rugged surface thus formed are processed so as to result in the surface shape (b). Finally, those flat and curved parts of the rugged surface which have been thus processed are processed so as to result in the surface shape (c). Besides being thus processed in the order of (a)→(b)→(c), the substrate surface may be subjected to two kinds of surface processings in the order of (a)→(b), (a)→(c), or (b)→(c). The conductive substrate having surface shapes having such different combinations has an exceedingly large surface area.

In the invention, a conductive diamond is formed on the surface having the surface shape described above.

Due to the use of the substrate having such combinations, the electrodes for electrolysis (conductive diamond electrodes) of the invention have improved durability. The reasons for this are presumed to be as follows.

(1) The diamond layer has an increased surface area due to the increased surface area of the substrate and, hence, the effective current density during electrolysis can be reduced.

(2) The increased surface area of the substrate enables a diamond layer to be deposited in an increased amount under the same CVD process conditions and, hence, the effective catalyst amount increases.

(3) An improved anchoring effect is obtained at the interface between the substrate and the diamond layer.

The invention proposes optimal surface shapes for a conductive substrate for use in an electrode for electrolysis (conductive diamond electrode) produced by coating the conductive substrate with a diamond layer by any of various methods, in particular, CVD. The surface shapes can improve adhesion between the substrate and the diamond layer and reduce the effective current density during electrolysis. Furthermore, the effective volume of the diamond layer can be increased. Because of these, a diamond electrode which can stably withstand long-term use even in highly corrosive electrolytic solutions can be provided. Therefore, industrial use of this diamond electrode can be expected.

The reference numerals used in the drawings denote the followings, respectively.

| 11, 13, 15, 17 | conductive substrate |
| 12, 14, 16, 21 | diamond layer |
| 18 | large top/valley |
| 19 | medium top/valley |
| 20 | fine top/valley |

DETAILED DESCRIPTION OF THE INVENTION

The electrodes for electrolysis proposed by the invention and processes for producing the electrodes will be explained below in detail.

The shape of the substrate is not limited to a plate, and can be a perforated plate or the like obtained by mesh-forming processing or punching.

The surface of the substrate to be used in the electrodes for electrolysis of the invention is processed so as to have any of large tops/valleys, medium tops/valleys, and fine tops/valleys or to have two or more selected from the large tops/valleys, medium tops/valleys, and fine tops/valleys.

In the invention, the substrate having the surface shape (a), which is a combination of an Ra of 100-1,000 μm and an RSm of 50-10,000 μm, is referred to as substrate having large tops/valleys. Beside, the substrates having the surface shapes (b) and (c), which are a combination of an Ra of 2.5-100 μm and an RSm of 1.5-800 μm and a combination of an Ra of 0.01-2 μm and an RSm of 0.005-250 μm, are referred to as substrates having medium tops/valleys and fine tops/valleys, respectively.

FIGS. 2 to 5 are diagrammatic views illustrating embodiments of the electrodes for electrolysis according to the invention.

Figure 2:
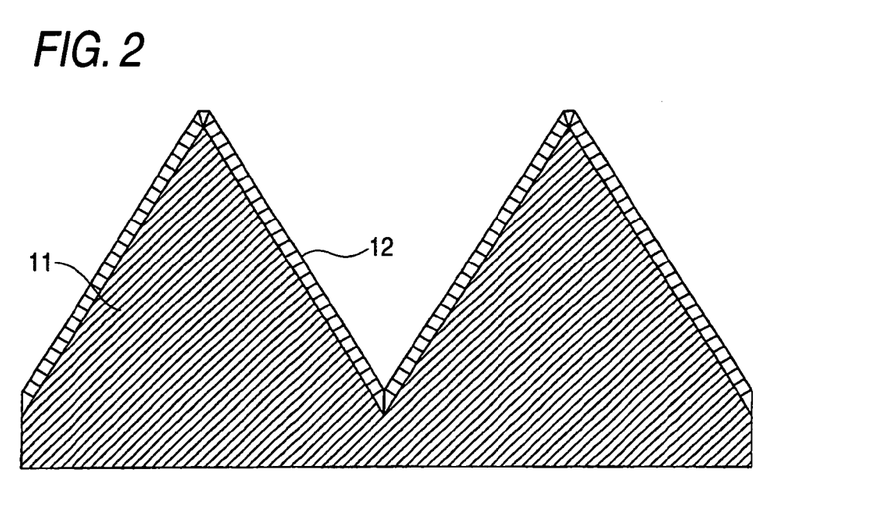
FIG. 2 is a diagrammatic view of an embodiment comprising a substrate having large tops/valleys and a diamond layer formed thereon.

FIG. 2 illustrates an embodiment comprising a substrate 11 having large tops/valleys and a diamond layer 12 formed thereon.

Figure 3:
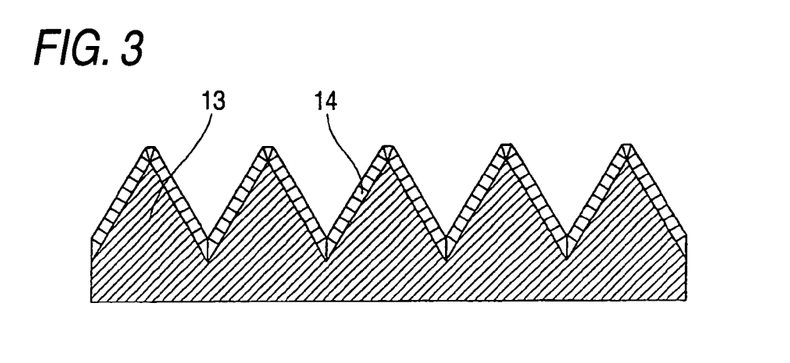
FIG. 3 is a diagrammatic view of an embodiment comprising a substrate having medium tops/valleys and a diamond layer formed thereon.

FIG. 3 illustrates an embodiment comprising a substrate 13 having medium tops/valleys and a diamond layer 14 formed thereon.

Figure 4:
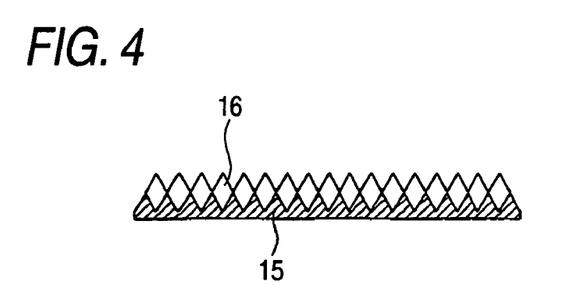
FIG. 4 is a diagrammatic view of an embodiment comprising a substrate having fine tops/valleys and a diamond layer formed thereon.

Likewise, FIG. 4 illustrates an embodiment comprising a substrate 15 having fine tops/valleys and a diamond layer 16 formed thereon.

Figure 5:
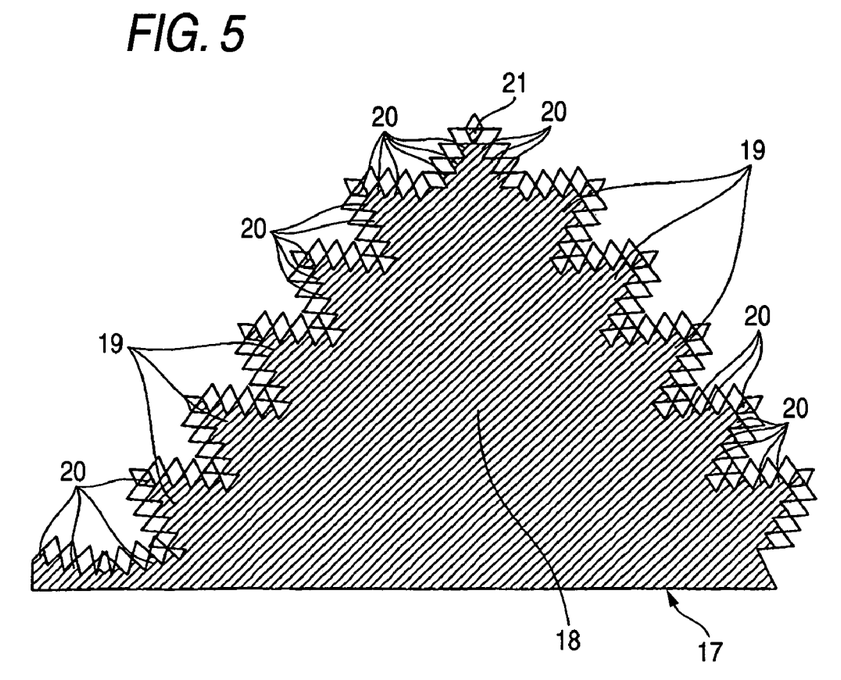
FIG. 5 is a diagrammatic view of an embodiment comprising a substrate having all of large tops/valleys, medium tops/valleys, and fine tops/valleys and a diamond layer formed thereon.

FIG. 5 illustrates an embodiment comprising a substrate having all of large tops/valleys, medium tops/valleys, and fine tops/valleys and a diamond layer formed thereon. First, large tops/valleys 18 are formed on the surface of a conductive substrate 17 so that each resultant top/valley (only one is shown in FIG. 5) has the shape of inverted V. Subsequently, medium tops/valleys 19 each of an inverted-V shape are formed on the inclined surfaces of the large tops/valleys 18. Furthermore, fine tops/valleys 20 each of an inverted-V shape are formed on the inclined surfaces of the medium tops/valleys 19. Finally, the surface of the fine tops/valleys 20 of the conductive substrate 17 is coated with diamond particles to form a diamond layer 21.

For obtaining a homogeneous diamond layer, it is desirable that a feed gas should be evenly supplied to the substrate surface in the CVD process which will be described later. From the standpoint of gas supply, Ra and RSm are preferably 100-1,000 μm and 50-10,000 μm, respectively. Such large tops/valleys are preferably formed by machining such as cutting, polishing, embossing, or pressing. It is also preferred to use a method in which when a metal plate for use as a substrate is molded, a surface shape having tops/valleys is imparted thereto during the molding operation. Furthermore, use can be made of a method in which a metal or alloy is additionally deposited by a technique such as hot dipping, PVD, or CVD.

For forming the medium tops/valleys, blasting is preferred. It is preferred that after blasting, the substrate be subjected to ultrasonic cleaning or cleaning with an acid/alkali for the purpose of removing the abrasive particles remaining on the substrate surface.

When blasting is conducted, the particles used partly adhere to or pierce in the substrate surface and remain. The residual particles not only may exert an influence not a little on the formation of diamond nuclei, but prevent the diamond layer from growing in substrate plane directions. The residual particles hence influence the adhesion of the diamond layer. In addition, the residual particles inhibit current supply in electrolysis as final use. Ultrasonic cleaning physically removes the abrasive particles remaining, while cleaning with an acid/alkali enables abrasive particle removal through dissolution of the residual abrasive particles and the substrate.

Cleaning with an acid/alkali has the effect of etching lattice defects present at crystal grain boundaries and in crystal grains of the substrate and thereby adding fine tops/valleys to the medium tops/valleys. There are case where even when acid/alkali cleaning having an etching effect is conducted, the values of Ra and RSm change little depending on the selection of a plane-direction evaluation length in determining Ra and RSm. However, the surface shape observed with a laser microscope or an electron microscope changes considerably.

There are case where excessive cleaning with an acid/alkali diminishes the fine tops/valleys which have been formed by the etching effect and the medium tops/valleys and thereby smooths rather than roughens the substrate surface. Excessive acid/alkali cleaning should hence be avoided.

Niobium and tantalum are highly resistant to or have a low rate of corrosion by most acids other than hydrofluoric acid and most alkalis other than caustic potash and caustic soda. Such most acids and alkalis cannot hence be used for industrially obtaining fine tops/valleys. Hydrofluoric acid is a highly excellent acid for the etching of niobium and tantalum. When hydrofluoric acid is used alone, the substrate surface is not deprived of fine tops/valleys however large the etching amount is. However, use of hydrofluoric acid alone has a drawback that a prolonged etching time is required for the fine tops/valleys to be formed. Another drawback is that the hydrogen generated is absorbed, although the hydrogen absorbed is removed when the substrate is heated at 700-900° C. in a diamond layer formation step and, hence, does not lead to substrate embrittlement. Caustic potash and caustic soda necessitate an even longer time.

For accomplishing acid cleaning in a short time, use is generally made of nitric-hydrofluoric acid, which is a mixture of hydrofluoric acid and nitric acid. However, nitric-hydrofluoric acid is too high in the effect of smoothing the substrate surface described above and cannot form fine tops/valleys. For reducing the time required for acid cleaning, it is effective to bring platinum into contact with the substrate to shift the corrosion potential to the nobler side. In this case, fine tops/valleys can be formed. However, an area near the contact point comes to slightly differ in corroded state from the other areas. Consequently, in the case of using a large electrode substrate, it should be carefully covered with a platinum net.

The present inventors have found that by using hydrogen peroxide as an additive to be added to hydrofluoric acid, a substrate dissolution amount sufficient for abrasive particle removal can be secured and fine tops/valleys can be formed in a time period as short as several tens of minutes. The inventors have further found etching conditions which cause neither hydrogen generation nor hydrogen absorption.

For example, a substrate sample is immersed for 10-20 minutes in a 60° C. aqueous solution having $H_2O_2$ (hydrogen peroxide) of 2% by weight and HF (hydrofluoric acid) of 5% by weight. Time periods longer than the upper limit are undesirable because such long-term immersion may smooth the surface shape having medium tops/valleys and the fine tops/valleys which have been formed.

The surface shape of the substrate which has been thus treated is preferably as follows. (1) In the case where the substrate is one in which no large tops/valleys have been formed, Ra is 2.5-100 μm and RSm is 1.5-800 μm with respect to any desired evaluation length. (2) In the case where the substrate is one in which large tops/valleys have been formed, Ra and RSm are the same as those shown above when the distance between the top and the valley in each element in a roughness curve for the large tops/valleys is taken as an evaluation length.

Furthermore, it is preferred to impart fine tops/valleys, i.e., a surface shape having an Ra of 0.01-2 μm and an RSm of 0.005-250 μm, to the substrate surface in order to improve adhesion strength between the substrate and the diamond layer. It is more preferable that the surface shape is one having an Ra of 0.01-0.1 μm and an RSm of 0.005-20 μm. For forming this surface shape, heat treatment can be advantageously used besides the etching treatment.

More specifically, the heat treatment may be accomplished by heating the substrate in a vacuum or an inert atmosphere at 750-1,300° C. in the case of niobium or at 960-1,600° C. in the case of tantalum. The surface shape of the substrate which has been thus treated is preferably as follows. (1) In the case where the substrate is one in which neither large tops/valleys nor medium tops/valleys have been formed, Ra is 0.01-0.1 μm and RSm is 0.005-20 μm with respect to any desired evaluation length. (2) In the case where the substrate is one in which large tops/valleys only have been formed, Ra and RSm are the same as those shown above when the distance between the-top and the valley in each element in a roughness curve for the large tops/valleys is taken as an evaluation length. (3) In the case where the substrate is one in which medium tops/valleys have been formed, Ra and RSm are the same as those shown above when the distance between the top and the valley in each element in a roughness curve for the medium tops/valleys is taken as an evaluation length.

When a diamond layer is to be formed by CVD, it is desirable that the substrate surface be subjected to the marring treatment and seeding treatment prior to a CVD process. For these treatments can be used a method in which the substrate is polished with fine diamond particles or a method in which the substrate is immersed in water containing fine diamond particles suspended therein and ultrasonic is applied thereto.

Use may be made of a method in which a coating layer comprising at least one of niobium and tantalum is formed on the surface of the conductive substrate and a conductive diamond layer is deposited on this coating layer.

As a technique of CVD for forming the diamond layer, use can be made of the microwave plasma CVD method, hot-filament CVI) method, or the like. A typical example of the hot-filament CVD method is explained below.

A material serving as a carbon source, such as a hydrocarbon gas, e.g., methane $CH_4$, or an alcohol, is introduced into a CVD chamber together with hydrogen gas. A filament has been disposed in the CVD chamber. The filament is kept at a temperature at which hydrogen radicals generate, i.e., 1,800-2,400° C. The substrate on which a diamond layer is to be formed also is disposed in the CVD chamber and kept at a temperature of 750-950° C., at which diamond deposition occurs. The concentration of the hydrocarbon gas is 0.1-10 vol % based on the hydrogen, and the pressure is from 20 hPa to 1,013 hPa (1 atm).

In order to obtain diamond having satisfactory conductivity, it is indispensable to add a slight amount of an element differing in valence. The content of boron (B) or phosphorus (P) is preferably 1-100,000 ppm, more preferably 100-10,000 ppm. Trimethylboron (($CH_3)_3B$) is used as a raw-material compound. It is also preferred to use a less toxic compound such as boron oxide ($B_2O_3$) or diphosphorous pentoxide ($P_2O_5$).

Higher growth rates (deposition rates) are industrially preferred. However, there is an optimal range of deposition rate (0.1-5 μm/h) from the standpoints of satisfactorily maintaining diamond quality and of productivity.

When a substrate having one or more of the surface shapes specified in the invention is used, not only the adhesion of the diamond layer deposited by CVD to the substrate is improved, but also the diamond layer can be deposited in a larger amount using the same amount of electrical energy without changing the conditions for diamond layer deposition by CVD and the time. Namely, in the case where the surface area of a substrate is increased threefold by regulating the surface shape thereof, diamond can be deposited in about a threefold amount in the same time. Life prolongation under electrolytic conditions accompanied by electrode consumption and considerable corrosion can hence be expected from the standpoints of both diamond layer amount and current density.

EXAMPLES

The present invention is now illustrated in greater detail with reference to Examples and Comparative Examples, but it should be understood that the present invention is not to be construed as being limited thereto.

Example 1

A niobium metal plate having a size of 30 mm×30 mm and a thickness of 2 mm (substrate sample) was blasted by blowing #60 alumina particles against both sides of the plate using 0.7 MPa compressed air.

Subsequently, the substrate sample was immersed for 10 minutes in a 60° C. aqueous solution having $H_2O_2$ (hydrogen peroxide) of 2 wt % and HF (hydrofluoric acid) of 5 wt %, thereafter subjected to ultrasonic cleaning in pure water at 28 kHz and 300 W for 15 minutes, and then dried. An examination with a laser microscope for surface shape revealed that this substrate sample had an Ra of 3.7 μm and an RSm of 34 μm, which correspond to medium tops/valleys.

Figure 6:
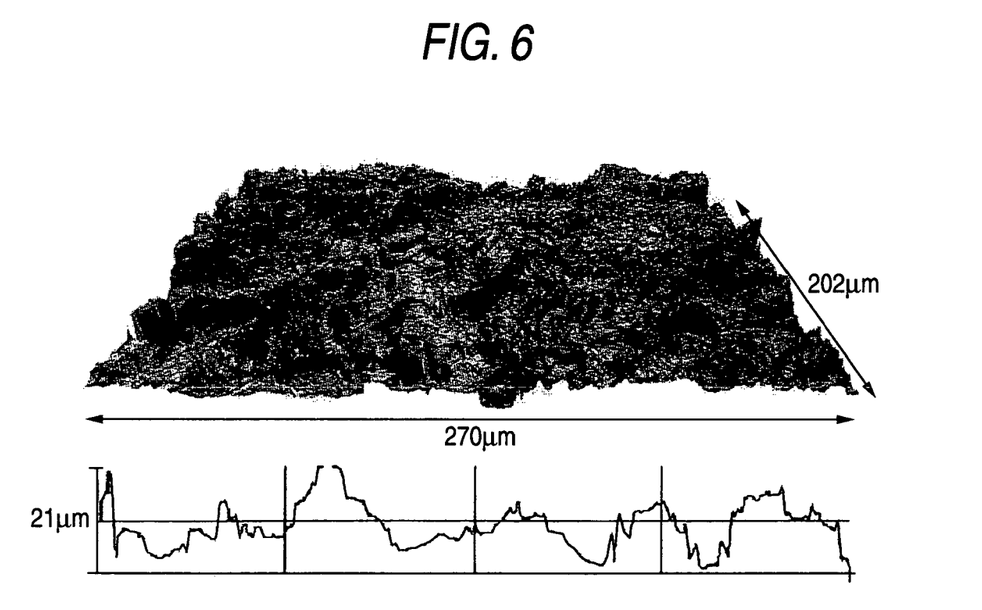
FIG. 6 shows a 3-D image obtained from a laser microscope photograph (1,000 magnifications) of a surface of the conductive substrate obtained in Example 1 (upper part) and a profile of a section of the 3-D image (lower part).

A 3-D image obtained from a laser microscope photograph (1,000 magnifications) of a surface of this conductive substrate is shown in the upper part of FIG. 6, and a profile of that width-direction section of this 3-D image which extends along the depth-direction center is shown in the lower part of FIG. 6.

A seeding treatment was then conducted in the following manner.

Into a 200-cc glass beaker were introduced 2 g of nanodiamond particles having an average particle diameter of 5 nm and 100 cc of ethanol. The components were mixed to sufficiently disperse the particles. The substrate was disposed in a suspended state in this suspension so that the area in which the substrate was in contact with the surrounding vessel was diminished. Ultrasonic was applied at 100 kHz and 100 W for 5 minutes. Immediately thereafter, the substrate was pulled out of the suspension, and it was then gradually heated to 60° C. and sufficiently dried.

Subsequently, a hot-filament CVD apparatus was used to directly deposit diamond on the substrate under the following conditions. First, the substrate was set in the hot-filament CVD apparatus. Ethyl alcohol was used as a carbon source, and boron oxide was dissolved therein beforehand in a concentration of 1,500 ppm. Hydrogen gas was caused to flow through the apparatus at a rate of 0.01 L/min, and part of the gas was bypassed through a carbon source vessel. The concentration of ethyl alcohol gas was 1 vol % based on the hydrogen. While causing these gases to flow through the apparatus, a current was permitted to flow through the filament and the CVD apparatus was heated to 1,800-2,400° C., i.e., a temperature for carbon radical generation. The temperature of the substrate located just under the filament was measured and was found to be 800° C. The CVD operation was continued for 5 hours and the substrate was then taken out.

It was ascertained through Raman spectroscopy that a diamond layer had deposited on the substrate.

From an electron photomicrograph of a section, the thickness of the diamond layer was found to be 5 μm. The diamond layer was examined with a laser microscope for surface area and, as a result, the surface area thereof in a projected observation area of 0.059 $mm^2$ was found to be 0.13 $mm^2$. The volume of the diamond layer calculated from the thickness and surface area of the diamond layer was $7.1 \times 10^{-4}$ $mm^3$ in a projected area of 0.059 $mm^2$. The diamond layer was examined with an optical microscope and, as a result, no peeled part was observed. Furthermore, a tape test in which neither crosshatch-wise incisions nor an X-cut was formed was conducted as a simplified version of the test as provided for in JIS K 5400. As a result, no peeling was observed.

The electrode thus produced was used as an anode after the area thereof was regulated to 1 $cm^2$ with a gasket. Using the anode together with a zirconium plate as a counter electrode, electrolysis was conducted in an aqueous solution prepared by dissolving citric acid in a concentration of 13.3 g/L in a 28.4 g/L aqueous solution of sodium sulfate, under the conditions of an electrode spacing of 1 cm, 60° C., and 0.3 A/$cm^2$. As a result, a stable cell voltage was maintained for 1,050 hours. The diamond electrode was ascertained to be usable over a practically sufficient long period.

Example 2

A tantalum metal plate having a size of 30 mm×30 mm and a thickness of 2 mm (substrate sample) was blasted by blowing #36 alumina particles against both sides of the plate using 0.5 MPa compressed air. Subsequently, the substrate sample was immersed for 20 minutes in a 60° C. aqueous solution having $H_2O_2$ (hydrogen peroxide) of 2 wt % and HF (hydrofluoric acid) of 5 wt %, thereafter subjected to ultrasonic cleaning in pure water at 28 kHz and 300 W for 15 minutes, and then dried. The substrate surface had a shape having an Ra of 11.8 μm and an RSm of 50 μm, which correspond to medium tops/valleys.

Subsequently, a seeding treatment and diamond layer formation were conducted in the same manners as in Example 1.

It was ascertained through Raman spectroscopy that a diamond layer had deposited on the substrate. From an electron photomicrograph of a section, the thickness of the diamond layer was found to be 5 μm. The diamond layer was examined with a laser microscope for surface area and, as a result, the surface area in a projected observation area of 0.059 $mm^2$ was found to be 0.22 $mm^2$. The volume of the diamond layer calculated from the thickness and surface area of the diamond layer was $10.4 \times 10^{-4}$ $mm^3$ in a projected area of 0.059 $mm^2$.

The diamond layer was examined with an optical microscope and, as a result, no peeled part was observed. Furthermore, a tape test was conducted in the same manner as in Example 1. As a result, no peeling was observed.

The electrode thus produced was used to conduct electrolysis under the same conditions as in Example 1. As a result, a stable cell voltage was maintained for 1,880 hours. The diamond electrode was ascertained to be usable over a practically sufficient long period.

Comparative Example 1

A niobium metal plate having a size of 30 mm×30 mm and a thickness of 2 mm (substrate sample) was blasted by blowing #60 alumina particles against both sides of the plate using 0.7 MPa compressed air. Subsequently, the substrate sample was immersed for 60 minutes at room temperature in an aqueous nitric-hydrofluoric acid solution having $HNO_3$ (nitric acid) of 20 wt % and HF (hydrofluoric acid) of 7 wt %.

This substrate sample was then subjected to ultrasonic cleaning in pure water at 28 kHz and 300 W for 15 minutes and dried. The substrate sample suffered a weight reduction of 300 g/m², and the surface thereof was glossy and smooth. This substrate was examined for surface shape and was found to have an Ra of 2.3 µm and an RSm of 200 µm. That value of Ra was intermediate between medium tops/valleys and fine tops/valleys.

Subsequently, a seeding treatment and diamond layer formation were conducted in the same manners as in Example 1.

It was ascertained through Raman spectroscopy that a diamond layer had deposited. From an electron photomicrograph of a section, the thickness of the diamond layer was found to be 5 µm. The diamond layer was examined with a laser microscope for surface area and, as a result, the surface area in a projected observation area of 0.059 mm² was found to be 0.076 mm². The volume of the diamond layer calculated from the thickness and surface area of the diamond layer was $3.8 \times 10^{-4}$ mm³ in a projected area of 0.059 mm².

The diamond layer was examined with an optical microscope and, as a result, no peeled part was observed. A tape test was conducted in the same manner as in Example 1. As a result, diamond layer peeling was observed at an edge part of the substrate.

The electrode thus produced was used to conduct electrolysis under the same conditions as in Example 1. As a result, the cell voltage increased after 520 hours. After the electrolysis, the diamond on the substrate surface was found to have wholly disappeared.

Example 3

Three niobium metal plates having a size of 30 mm×30 mm and a thickness of 2 mm (substrate samples) were blasted by blowing #60 alumina particles against both sides thereof using 0.7 MPa compressed air. Subsequently, the niobium plates were subjected to ultrasonic cleaning in pure water at 28 kHz and 300 W for 15 minutes and then dried. Immediately thereafter, the niobium plates were introduced into a vacuum furnace and heated at a rate of 4° C./min while maintaining a vacuum of $10^{-3}$-$10^{-5}$ Pa. Thereafter, the first niobium plate was heated to 750° C., held at this temperature for 10 hours, and then allowed to cool to room temperature in the furnace at a rate of 4° C./min. The second niobium plate was heated to 1,090° C., held at this temperature for 1 hour, and then allowed to cool to room temperature in the furnace at a rate of 4° C./min. The third niobium plate was heated to 1,090° C., held at this temperature for 1 hour, subsequently further heated to 1,300° C., held at this temperature for 1 minute, and then allowed to cool to room temperature in the furnace at a rate of 4° C./min.

The first to third niobium plates which had undergone the heat treatments were examined for substrate surface shape. As a result, each plate was found to have an Ra of 2.3 µm and an RSm of 34 µm, which corresponded to medium tops/valleys. When the distance between the top and valley in each element in the roughness curves for the medium tops/valleys was taken as an evaluation length, the results of a surface shape examination of each plate were: the Ra was about 0.06 µm and the RSm was about 1 µm.

Subsequently, the three niobium plate substrates were subjected to a seeding treatment and diamond layer formation in the same manners as in Example 1. It was ascertained through Raman spectroscopy that a diamond layer had deposited on each sample. From an electron photomicrograph of a section, the thickness of the diamond layer in each sample was found to be 5 µm. Furthermore, the diamond layer in each sample was examined with a laser microscope for surface area and, as a result, the surface area thereof in a projected area of 0.059 mm² was found to be 0.13 mm². The volume of each diamond layer calculated from the thickness and surface area of the diamond layer was $7.1 \times 10^{-4}$ mm³ in a projected area of 0.059 mm². The diamond layers were examined with an optical microscope and, as a result, no peeled part was observed. A tape test was conducted in the same manner as in Example 1. As a result, no peeling was observed.

The electrodes thus produced were used to conduct electrolysis under the same conditions as in Example 1. As a result, a stable cell voltage was maintained for 1,540 hours, 1,610 hours, and 1,450 hours in electrolysis with the first niobium plate, second niobium plate, and third niobium plate, respectively. The diamond electrodes were ascertained to be usable over a practically sufficient long period.

Example 4

A silicon plate having a size of 30 mm×30 mm and a thickness of 2 mm (substrate sample) was immersed for 3 minutes in a 60° C. aqueous solution having $H_2O_2$ (hydrogen peroxide) of 2 wt % and HF (hydrofluoric acid) of 5 wt %. This substrate sample was thereafter subjected to ultrasonic cleaning in pure water at 28 kHz and 300 W for 15 minutes, and then dried.

The substrate was examined for surface shape. As a result, the substrate surface was found to have an Ra of about 0.1 µm and an RSm of about 1 µm, which correspond to fine tops/valleys.

Subsequently, a seeding treatment and diamond layer formation were conducted in the same manners as in Example 1.

It was ascertained through Raman spectroscopy that a diamond layer had deposited on the substrate. From an electron photomicrograph of a section, the thickness of the diamond layer was found to be 5 µm. The diamond layer was examined with a laser microscope for surface area and, as a result, the surface area in a projected area of 0.059 mm² was found to be 0.065 mm². The volume of the diamond layer calculated from the thickness and surface area of the diamond layer was $3.3 \times 10^{-4}$ mm³ in a projected area of 0.059 mm². The diamond layer was examined with an optical microscope and, as a result, no peeled part was observed. Furthermore, a tape test was conducted in the same manner as in Example 1. As a result, no peeling was observed.

The electrode thus produced was used to conduct electrolysis under the same conditions as in Example 1. As a result, a stable cell voltage was maintained for 800 hours. The diamond electrode was ascertained to be usable over a practically sufficient long period.

Example 5

One side of a niobium metal plate having a size of 30 mm×30 mm and a thickness of 4 mm (substrate sample) was machined to continuously form parallel incisions therein which each had a cross-section having the shape of an inverted regular triangle with a side length of 1 mm. This substrate was blasted by blowing #60 alumina particles against both sides of the substrate using 0.7 MPa compressed air. Subsequently, the substrate sample was immersed for 10 minutes in a 60° C. aqueous solution having $H_2O_2$ (hydrogen peroxide) of 2 wt % and HF (hydrofluoric acid) of 5 wt %, thereafter subjected to ultrasonic cleaning in pure water at 28 kHz and 300 W for 15 minutes, and then dried. The substrate surface had a shape having an Ra of 400 µm and an RSm of 1,010 µm, which correspond to large tops/valleys. When the distance between the top and valley in each element in the roughness curve for the large tops/valleys was taken as an evaluation length, the shape of the substrate surface had an Ra of about 3.7 μm and an RSm of 34 μm, which correspond to medium tops/valleys.

Subsequently, a seeding treatment and diamond layer formation were conducted in the same manners as in Example 1. It was ascertained through Raman spectroscopy that a diamond layer had deposited. From an electron photomicrograph of a section, the thickness of the diamond layer was found to be 5 μm. The diamond layer was examined with a laser microscope for surface area and, as a result, the surface area in a projected observation area of 0.059 mm$^2$ was found to be 0.26 mm$^2$. The volume of the diamond layer calculated from the thickness and surface area of the diamond layer was $1.3 \times 10^{-3}$ mm$^3$ in a projected area of 0.059 mm$^2$.

The diamond layer was examined with an optical microscope and, as a result, no peeled part was observed. Furthermore, a tape test was conducted in the same manner as in Example 1. As a result, no peeling was observed.

The electrode thus produced was used to conduct electrolysis under the same conditions as in Example 1. As a result, a stable cell voltage was maintained for 2,150 hours. The diamond electrode was ascertained to be usable over a practically sufficient long period.

Example 6

One side of each of three niobium metal plates having a size of 30 mm×30 mm and a thickness of 4 mm (substrate samples) was machined to continuously form parallel incisions therein which each had a cross-section having the shape of an inverted regular triangle with a side length of 1 mm. These substrates were blasted by blowing #60 alumina particles against both sides of the substrate using 0.7 MPa compressed air. Subsequently, the substrate samples were immersed for 10 minutes in a 60° C. aqueous solution having H$_2$O$_2$ (hydrogen peroxide) of 2 wt % and HF (hydrofluoric acid) of 5 wt %, thereafter subjected to ultrasonic cleaning in pure water at 28 kHz and 300 W for 15 minutes, and then dried. Immediately thereafter, the niobium plates were introduced into a vacuum furnace and heated at a rate of 4° C./min while maintaining a vacuum of $10^{-3}$-$10^{-5}$ Pa. Thereafter, the first niobium plate was heated to 750° C., held at this temperature for 10 hours, and then allowed to cool to room temperature in the furnace at a rate of 4° C./min. The second niobium plate was heated to 1,090° C., held at this temperature for 1 hour, and then allowed to cool to room temperature in the furnace at a rate of 4° C./min. The third niobium plate was heated to 1,090° C., held at this temperature for 1 hour, subsequently further heated to 1,300° C., held at this temperature for 1 minute, and then allowed to cool to room temperature in the furnace at a rate of 4° C./min.

The surface of each niobium substrate had an Ra of 400 μm and RSm of 1,010 μm, which corresponded to large tops/valleys. When the distance between the top and valley in each element in the roughness curve for the large tops/valleys was taken as an evaluation length, the shape of the surface of each substrate had an Ra of about 3.7 μm and RSm of 34 μm. When the distance between the top and valley in each element in the roughness curve for the medium tops/valleys having an Ra of about 3.7 μm and an RSm of 34 μm was taken as an evaluation length, then the results of a surface shape examination of each substrate were: the Ra was about 0.06 μm and the RSm was about 1 μm.

Subsequently, the substrates were subjected to a seeding treatment and diamond layer formation in the same manners as in Example 1. It was ascertained through Raman spectroscopy that a diamond layer had deposited on each substrate. From an electron photomicrograph of a section, the thickness of the diamond layer was found to be 5 μm. Furthermore, the diamond layer on each substrate was examined with a laser microscope for surface area and, as a result, the surface area thereof in a projected observation area of 0.059 mm$^2$ was found to be 0.26 mm$^2$. The volume of each diamond layer calculated from the thickness and surface area of the diamond layer was $1.3 \times 10^{-3}$ mm$^3$ in a projected area of 0.059 mm$^2$.

The diamond layers were examined with an optical microscope and, as a result, no peeled part was observed. Furthermore, a tape test was conducted in the same manner as in Example 1. As a result, no peeling was observed.

The electrodes thus produced were used to conduct electrolysis under the same conditions as in Example 1. As a result, a stable cell voltage was maintained for 2,900 hours, 3,210 hours, and 2,720 hours in electrolysis with the first niobium plate, second niobium plate, and third niobium plate, respectively. The diamond electrodes were ascertained to be usable over a practically sufficient long period.

Comparative Example 2

One side of a niobium metal plate having a size of 30 mm×30 mm and a thickness of 4 mm (substrate sample) was machined to continuously form parallel incisions therein which each had a cross-section having the shape of an inverted regular triangle with a side length of 3 mm. This substrate was blasted by blowing #60 alumina particles against both sides of the substrate using 0.7 MPa compressed air. Subsequently, the substrate sample was immersed for 10 minutes in a 60° C. aqueous solution having H$_2$O$_2$ (hydrogen peroxide) of 2 wt % and HF (hydrofluoric acid) of 5 wt %, thereafter subjected to ultrasonic cleaning in pure water at 28 kHz and 300 W for 15 minutes, and then dried. The substrate surface had a shape having an Ra of 1,300 μm and an RSm of 1,250 μm; the Ra value was larger than in large tops/valleys. When the distance between the top and valley in each element in the roughness curve for these tops/valleys was taken as an evaluation length, the shape of the substrate surface had an Ra of about 3.7 μm and an RSm of 34 μm.

Subsequently, a seeding treatment and diamond layer formation were conducted in the same manners as in Example 1. It was ascertained through Raman spectroscopy that a diamond layer had deposited on around the top in each element in the roughness curve for the large tops/valleys. In areas around the valleys, however, no diamond was detected and the presence of graphite was ascertained. It was found from an electron photomicrograph of a section that the thickness of the diamond layer was 5 μm in that range of each element in the roughness curve for the large tops/valleys which extended from the top to a depth of 2,000 μm therefrom. The diamond layer was found to abruptly become thin as the depth exceeded that value. No diamond was observed in the valleys.

In a visual examination, an area around the top in each element in the roughness curve for the large tops/valleys looked light gray but an area around the valley looked dark. The diamond layer was examined with an optical microscope and, as a result, no peeled part was observed in the area around the top in each element in the roughness curve for the large tops/valleys. However, many peeled parts were observed in areas located at depths not smaller than 2,000 μm from the tops.

Furthermore, a tape test was conducted in the same manner as in Example 1. As a result, separation of graphite in the form of black particles occurred around the valley in each element in the roughness curve for the large tops/valleys, although no peeled part was observed around the top in each element in the roughness curve.

The electrode thus produced was used to conduct electrolysis under the same conditions as in Example 1. As a result, the cell voltage increased abruptly at 300 hours after the electrolysis initiation. After the electrolysis, the diamond other than that around the top in each element in the roughness curve for the large tops/valleys had wholly separated from the substrate. An electron photomicrograph of a section taken after the electrolysis revealed that the exposed parts of the substrate had corroded.

While the present invention has been described in detail and with reference to specific embodiments thereof, it will be apparent to one skilled in the art that various changes and modifications can be made therein without departing from the spirit and scope thereof.

The present application is based on Japanese Patent Application No. 2005-225476 filed on Aug. 3, 2005, and the contents thereof are incorporated herein by reference.

What is claimed is:

1. An electrode for electrolysis comprising:
 a conductive substrate; and
 a conductive diamond formed on a surface of the conductive substrate,
 the conductive substrate having at least one surface shape selected from the group consisting of:
   (a) a surface shape of a combination of an Ra of 100-1,000 μm and an RSm of 50-10,000 μm;
   (b) a surface shape of a combination of an Ra of 2.5-100 μm and an RSm of 1.5-800 μm; and
   (c) a surface shape of a combination of an Ra of 0.01-2 μm and an RSm of 0.005-250 μm.

2. The electrode for electrolysis according to claim 1, wherein the surface shape (c) is a combination of an Ra of 0.01-0.1 μm and an RSm of 0.005-20 μm.

3. A process for producing an electrode for electrolysis, the process comprising:
 conducting a surface treatment on a surface of a conductive substrate by at least one method selected from the group consisting of:
   (a) machining to form recesses and protrusions having an Ra of 100-1,000 μm and an RSm of 50-10,000 μm on the surface of the conductive substrate;
   (b) blasting to form recesses and protrusions having an Ra of 2.5-100 μm and an RSm of 1.5-800 μm; and
   (c) at least one of etching and heat-treating to form recesses and protrusions having an Ra of 0.01-2 μm and an RSm of 0.005-250 μm on the surface of the conductive substrate, and
 coating the conductive substrate having the recesses and protrusions with a conductive diamond layer.

4. The process for producing an electrode for electrolysis according to claim 3,
 wherein the method (c) is at least one of etching and heat-treating to form recesses and protrusions having an Ra of 0.01-0.1 μm and an RSm of 0.005-20 μm on the surface of the conductive substrate.

5. The process for producing an electrode for electrolysis according to claim 3,
 wherein the coating of the surface of the conductive substrate with the conductive diamond layer is conducted by the CVD method.

* * * * *